(12) United States Patent
Giovannini et al.

(10) Patent No.: US 9,916,873 B2
(45) Date of Patent: Mar. 13, 2018

(54) EXTENDED CAPACITY MEMORY MODULE WITH DYNAMIC DATA BUFFERS

(71) Applicant: Rambus Inc., Sunnyvale, CA (US)

(72) Inventors: Thomas J. Giovannini, San Jose, CA (US); John Eric Linstadt, Palo Alto, CA (US)

(73) Assignee: Rambus Inc., Sunnyvale, CA (US)

( * ) Notice: Subject to any disclaimer, the term of this patent is extended or adjusted under 35 U.S.C. 154(b) by 46 days.

(21) Appl. No.: 15/013,032

(22) Filed: Feb. 2, 2016

(65) Prior Publication Data

US 2016/0239208 A1  Aug. 18, 2016

Related U.S. Application Data

(60) Provisional application No. 62/115,591, filed on Feb. 12, 2015, provisional application No. 62/207,610, filed on Aug. 20, 2015.

(51) Int. Cl.
G11C 5/04 (2006.01)
G11C 5/06 (2006.01)
G11C 7/10 (2006.01)
G11C 7/22 (2006.01)

(52) U.S. Cl.
CPC ............... *G11C 5/04* (2013.01); *G11C 5/063* (2013.01); *G11C 7/10* (2013.01); *G11C 7/22* (2013.01)

(58) Field of Classification Search
CPC ....................................................... G11C 5/04

USPC ..................................................... 365/230.03
See application file for complete search history.

(56) References Cited

U.S. PATENT DOCUMENTS

| 5,790,447 | A | * | 8/1998 | Laudon | ..................... G11C 5/04 365/230.03 |
|---|---|---|---|---|---|
| 6,742,098 | B1 | | 5/2004 | Halbert et al. | |
| 7,200,023 | B2 | | 4/2007 | Foster, Sr. | |
| 8,199,515 | B2 | | 6/2012 | Bandholz et al. | |
| 8,275,936 | B1 | | 9/2012 | Haywood et al. | |
| 8,866,023 | B2 | | 10/2014 | Kadri et al. | |
| 2008/0052462 | A1 | | 2/2008 | Blakely et al. | |
| 2009/0031078 | A1 | | 1/2009 | Warnes et al. | |
| 2012/0331219 | A1 | | 12/2012 | Cai | |

\* cited by examiner

*Primary Examiner* — Jason Lappas
(74) *Attorney, Agent, or Firm* — Fenwick & West LLP

(57) ABSTRACT

A memory module uses dynamic data buffers for providing extended capacity for computing systems. The memory module comprises an external interface having a first set of data pins and a second set of data pins. The memory module includes a first set of memory chips and a second set of memory chips. The memory module includes a first registering clock driver to control the first set of memory chips and a second registering clock driver to control the second set of memory chips. The memory module further includes a first data buffer to connect the first set of memory chips to the first set of data pins and a second data buffer to connect the second set of memory chips to the second set of data pins.

19 Claims, 9 Drawing Sheets

EXTENDED CAPACITY MEMORY MODULE WITH DYNAMIC DATA BUFFERS

CROSS-REFERENCE TO RELATED APPLICATIONS

This application claims the benefit of U.S. Provisional Application No. 62/115,591, filed Feb. 12, 2015, and U.S. Provisional Application No. 62/207,610, filed Aug. 20, 2015, each of which is incorporated by reference in its entirety.

BACKGROUND

A motherboard of a computer system includes a fixed number of slots for inserting memory modules. The CPU (central processing unit) of the computer system has a fixed set of pins connected to the slots. Increasing memory of the computer system typically requires using more memory modules for higher capacity that increase the loading on a memory bus. As a result, the amount of the memory accessible to the computer system is difficult to increase.

BRIEF DESCRIPTION OF THE DRAWINGS

The teachings of the embodiments herein can be readily understood by considering the following detailed description in conjunction with the accompanying drawings.

DETAILED DESCRIPTION OF EMBODIMENTS

Reference will now be made in detail to several embodiments, examples of which are illustrated in the accompanying figures. It is noted that wherever practicable similar or like reference numbers may be used in the figures and may indicate similar or like functionality. The figures depict embodiments for purposes of illustration only. One skilled in the art will readily recognize from the following description that alternative embodiments of the structures and methods illustrated herein may be employed without departing from the principles, or benefits touted, of the techniques described herein.

In one embodiment, a computing system utilizes a memory module with extended capacity to expand the memory capacity of the computing system. In an embodiment, the memory module with extended capacity is a double high memory module. The memory module can be double the height of a normal memory module and include double the memory chips. The memory module includes multiple registering clock drivers that control the memory chips while minimizing the load on a command and address channel. The memory module also includes dynamic data buffers that allow all the memory chips to be accessed without increasing the load on the data channel.

In one embodiment, the memory module comprises an external interface having a first set of data pins and a second set of data pins. The memory module includes a first set of memory chips and a second set of memory chips. The memory module includes a first registering clock driver to control the first set of memory chips and a second registering clock driver to control the second set of memory chips. The memory module further includes a first data buffer to connect the first set of memory chips to the first set of data pins and a second data buffer to connect the second set of memory chips to the second set of data pins.

Figure 1:
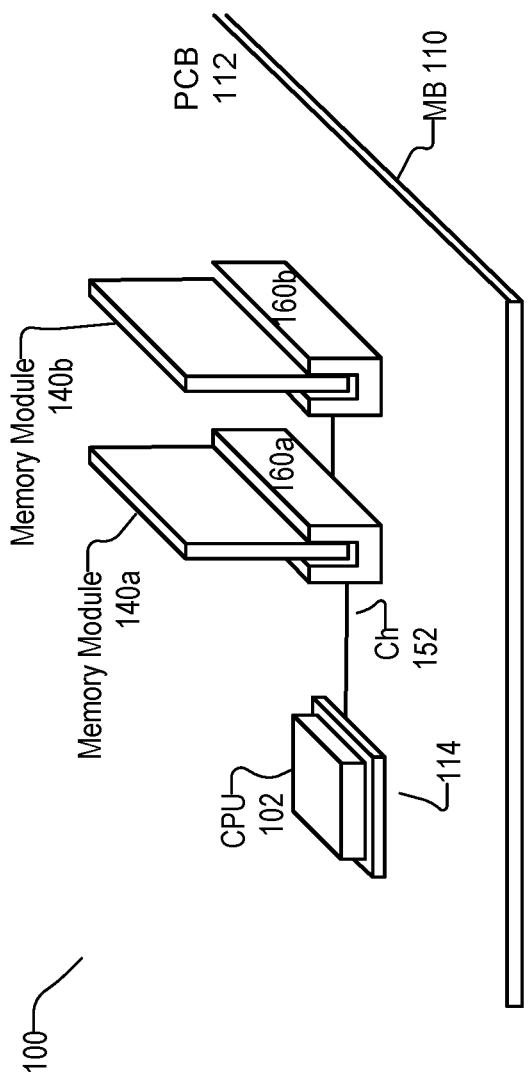
FIG. 1 is a computing system, according to an embodiment.

FIG. 1 is a computing system, according to an embodiment. Computing system 100 may be part of a computing device, such as a server or desktop computer. Computing system 100 includes a central processing unit (CPU), motherboard 110, and memory modules 140a, 140b. In some embodiments the memory modules 140a, 140b are double high dual inline memory modules (DIMMs.)

FIG. 1 and the other figures use like reference numerals to identify like elements. A letter after a reference numeral, such as "140a," indicates that the text refers specifically to the element having that particular reference numeral. A reference numeral in the text without a following letter, such as "140," refers to any or all of the elements in the figures bearing that reference numeral (e.g. "140" in the text refers to reference numerals "140a" and/or "140b" in the figures).

Memory modules 140a, 140b store data across multiple memory chips (not shown). A memory chip (MC) may store the data using dynamic random access memory (DRAM). In other embodiments the memory chips may store data in non-volatile memory (NVRAM). In some embodiments, one or more memory modules 140 are DIMMs. A memory chip may be a dual-die package memory chip or a three-dimensional stacked (3DS) memory chip.

The motherboard 110 includes several components, such as a printed circuit board (PCB) 112, memory module connectors 160a, 160b, and a CPU socket 114. CPU socket 114 is surface mounted to the PCB and is adapted to receive and hold CPU 102 to the motherboard 110. CPU 102 is an integrated circuit (IC) with an integrated memory controller. Examples of CPUs 102 include INTEL, AMD, ARM and IBM branded processors.

A memory controller is a circuit that manages the flow of data to and from the memory modules 140a, 140b via a memory channel 152. The memory channel 152 represents the communications pathway between the CPU 102 and the memory modules 140a, 140b. The memory controller 210 may be a circuit within the CPU 102 or a circuit outside the CPU 102. In some embodiments, CPU 102 may also be replaced with another type of IC that includes a memory controller, such as a memory controller hub that connects a CPU to memory.

Memory module connectors 160a, 160b are mounted to the motherboard 110, such as with surface mounting, through-hole mounting, or press-fit mounting. Examples of memory module connectors are memory module slots having a large number of connector pins (e.g., 288 pins) and latches to hold the memory modules in place. Memory modules 140a, 140b may be plugged into any of the memory module connectors 160a, 160b depending on the desired configuration of the computing system 100. Only one memory channel 152 and two memory module connectors 160a, 160b are shown in FIG. 1 for ease of illustration. In other embodiments there may be two or more memory channels and additional memory module connectors for the additional memory channels. Additionally, although only two memory connectors are shown for the memory channel 152 in FIG. 1, in other embodiments each memory channel 152 can be connected to a larger number (e.g., 3 or 4) of memory module connectors.

Figure 2:
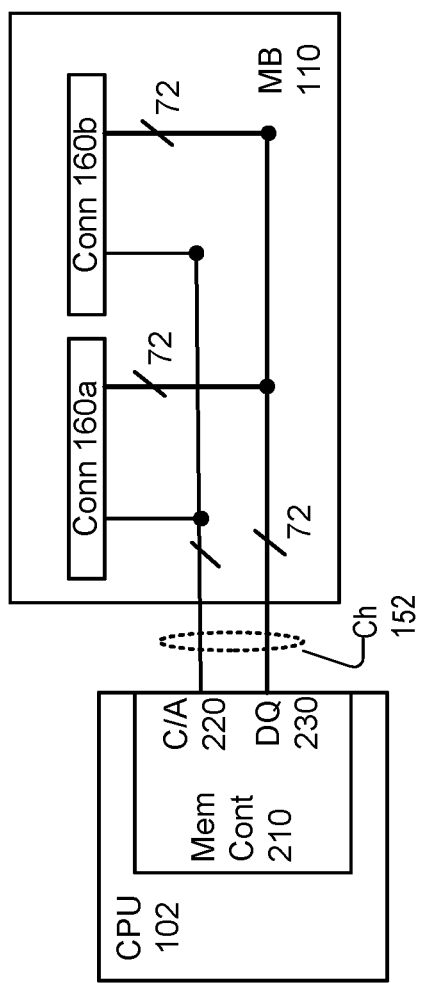
FIG. 2 illustrates electrical connections in the computing system of FIG. 1, according to an embodiment.

FIG. 2 illustrates electrical connections in the computing system of FIG. 1, according to an embodiment. The CPU 102 includes a memory controller 210 that transmits signals across and receives signals from a memory channel 152. Memory channel 152 electrically connects memory controller 210 to motherboard memory module connectors 160a, 160b. The memory channel 152 can be comprised of conductive signal traces routed on motherboard 110, memory modules 140a, 140b, and can also be comprised of other conductive components (e.g. connector pins, signal buffers, etc.).

Memory channel 152 is divided into a primary command and address (C/A) channel and a primary data channel 230. Primary C/A channel 220 carries C/A signals transmitted by the memory controller 210. C/A signals include, for example, chip select (CS), clock enable (CKE), address, bank address (BA), bank group (BG), row activate (ACT), row access strobe (RAS), column address strobe (CAS) and on-die termination (ODT) signals, among others. Primary C/A channel 220 electrically connects the memory controller 210 to both memory module connectors 160a and 160b so that the memory modules plugged into these memory module connectors 160a and 160b can be controlled by the memory controller 210.

Primary data channel 230 carries multiple data signals in parallel to and from the memory controller 210. For example, the primary data channel 230 can be 72 bits wide, and carry 64 bits of memory data and 8 bits of error correcting code (ECC) data. The primary data channel 230 may also carry data strobe signals (DQS, not shown) for the data, which would increase the number of signals in the data channel 230.

The CPU 102 interacts with memory modules connected to connectors 160a, 160b via the C/A channel 220 and data channel 230. As will be described in conjunction with the later figures, a memory module comprises memory chips, an external interface, one or more registering clock drivers, and data buffers. The external interface comprises data pins for receiving data signals from and transmitting data signals to the memory controller 210 during memory accesses. The registering clock drivers receive C/A signals from C/A channel 220 and generate C/A signals for the memory chips. The data buffers transmit data signals between the memory chips and the data pins of the external interface. The memory chips of the memory modules may be arranged using different layouts, for example, clam shell lay out or side by side layout described herein. In an embodiment, each registering clock driver is its own chip.

Figure 3:
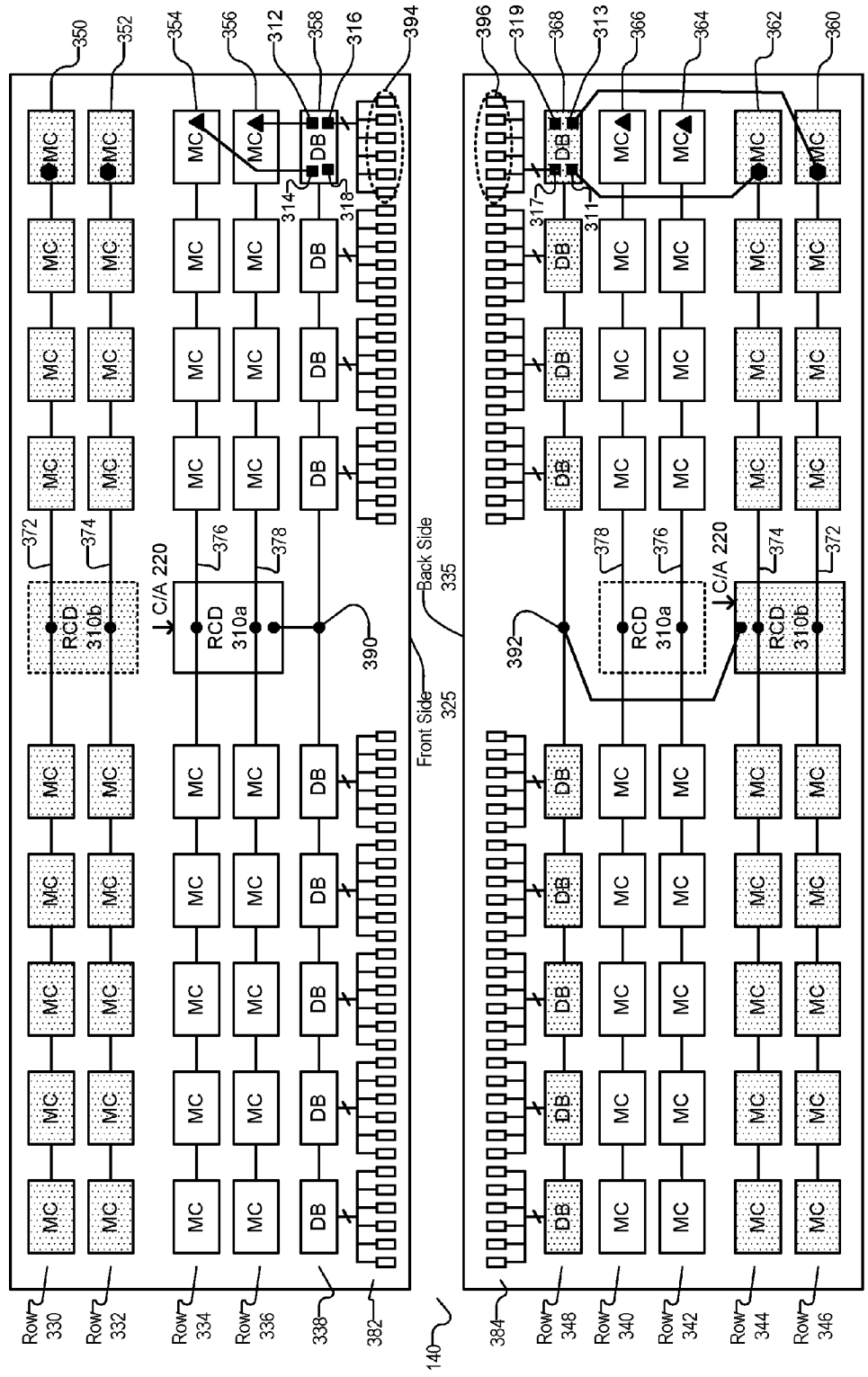
FIG. 3 illustrates a memory module with two registering clock drivers and eighteen data buffers with memory chips arranged in a clam shell layout, according to an embodiment.

FIG. 3 illustrates a memory module with two registering clock drivers and eighteen data buffers arranged in a clam shell layout, according to an embodiment. The memory module 140 includes two registering clock drivers (RCD) 310a and 310b. Each registering clock driver 310 provides secondary C/A signals for controlling a subset of memory chips MC attached to the memory module. Each registering clock driver 310 is its own IC chip.

The memory module 140 has a front side 325 and a back side 335. The memory module 140 has a set of memory chips MC attached to the front side 325 and another set of memory chips MC attached to the back side 335. FIG. 3 shows thirty six memory chips MC attached to the front side 325 of the memory module and thirty six memory chips MC attached to the back side 335 of the memory module. This type of layout is referred to as a clamshell layout as the memory chips MC are back to back on opposite sides of the memory module 140, and the back to back memory chips MC have their data pins and most of their address pins electrically connected together. Other embodiments may include a different number of memory chips MC on each side of the memory module 140.

In an embodiment, the memory chips attached to each side of a memory module 140 are arranged as rows and columns. As shown in FIG. 3, four rows 330, 332, 334, and 336 of nine memory chips each are attached to the front side 325 of the memory module. Similarly four rows 340, 342, 344, and 346 of nine memory chips each are attached to the back side 335 of the memory module 142. Other embodiments may include a different number of rows of memory chips MC attached to each side of the memory module and a different number of memory chips MC in each row.

In an embodiment, all memory chips of a row of memory chip are controlled by the same registering clock driver. FIG. 3 shows memory chips MC controlled by the registering clock driver 310b as shaded rectangles and memory chips MC controlled by the registering clock driver 310a as unshaded rectangles. As shown in FIG. 3, the registering clock driver 310a controls memory chips MC of rows 334 and 336 attached to the front side 325 of the memory module and rows 340 and 342 attached to the back side 335 of the memory module. Similarly, the registering clock driver 310b controls memory chips MC of rows 330 and 332 attached to the front side 325 of the memory module and rows 344 and 346 attached to the back side 335 of the memory module.

The external interface of the memory module 140 comprises a large number of data pins 382 and 384. Data pins 382 and 384 are conductive contacts that can mate with the module connectors 160 of the motherboard 110. FIG. 3 shows a set of data pins 382 on the front side 325 and a set of data pins 384 on the back side 335. The data pins of the external interface of the memory module 140 are logically grouped such that each group is a data nibble of the data channel 230. A data nibble can be a four bit portion of the data channel 230. A group of pins for a data nibble may include four pins for data signals and two pins for a differential data strobe signal DQS.

The data nibbles can be divided into even nibbles and odd nibbles. Even nibbles are the lower four bits within a data byte, and odd nibbles are the upper four bits within a data byte. For example, data bits 3:0 are an even data nibble and data bits 7:4 are an odd data nibble. As another example, data bits 11:8 are an even data nibble and data bits 15:9 are an odd data nibble.

In FIG. 3, the front side data pins 382 are even data nibbles. The back side data pins 384 are odd data nibbles. For example, the set 394 of front side data pins is an even nibble and the set 396 of back side data pins is an odd nibble. In general, each set of data pins connected to a data buffer DB is a nibble. Each set of front side data pins 382 connected to a data buffer is an even nibble and each set of back side data pins 384 connected to a data buffer is an odd nibble. Thus, there are 9 even data nibbles and 9 odd data nibbles in FIG. 3. In other embodiments the even data nibbles may be distributed amongst both the front side data pins 382 and the back side data pins 384. Similarly, the odd data nibbles may be distributed amongst both the front side data pins 382 and the back side data pins 384.

The memory module 140 includes two registering clock drivers (RCD) 310a and 310b. Each registering clock driver 310 includes a primary side input port coupled to the primary C/A channel 220. The registering clock driver 310 receives primary C/A signals via the primary C/A channel 220 and uses the primary C/A signals to generate secondary C/A signals for controlling memory accesses to the memory chips MC. The registering clock driver 310 also includes secondary side output ports that transmit the secondary C/A signals to the memory chips MC via secondary C/A channels 372, 374, 376, 378.

Address signals on the secondary C/A channels 372, 374, 376, 378 may be buffered versions of the primary C/A signals. Other signals on the secondary C/A channels 372, 374, 376, 378, such as chip select signals, may be logical combinations of the primary C/A signals. Each row of memory chips MC receives its own set of chip select signals. RCD 310a generates four sets of chip select signals, one for each row 334, 336, 340 and 342. RCD 310b generates four sets of chip select signals, one for each row 330, 332, 344, 346. The dedicated chip select signals for each memory chip row allows the memory chip rows 330, 332, 334, 336, 340, 342, 344, 346 to be independently addressable from each other.

The registering clock driver 310 includes secondary side ports that connect the registering clock driver 310 via secondary C/A channels 372, 374, 376, 378 to memory chips MC. Secondary C/A channel 372 connects the registering clock driver 310b to rows 330 and 346 of memory chips MC. Secondary C/A channel 374 connects the registering clock driver 310b to rows 332 and 344 of memory chips MC. Secondary C/A channel 376 connects the registering clock driver 310a to rows 334 and 342 of memory chips MC. Secondary C/A channel 378 connects the registering clock driver 310a to rows 336 and 340 of memory chips MC. Secondary C/A channels 372, 374, 376, 378 can be formed from conductive traces. Registering clock driver 310b controls rows 330, 332, 344 and 346. Registering clock driver 310a controls rows 334, 336, 340, and 342.

The memory module 140 includes data buffers DB to connect memory chips MC with data pins of the external interface, and to buffer data signals in both directions between the memory chips MC and the external interface. A set of nine data buffers DB arranged in a row 338 is attached to the front side 325 of the memory module 140 and a set of nine data buffers DB arranged in a row 348 is attached to the back side 335 of the memory module 140. In one embodiment each data buffer DB is separate IC chip.

In an embodiment each data buffer DB connects a set of memory chips MC with data pins of a single data nibble and buffers data between the memory chips MC and the data pins of the data nibble. For example, the data buffer 358 connects memory chips 354, 356 attached to the front side 325 of the memory module and memory chips 364, 366 attached to the back side 335 of the memory module with a set of data pins for a front-side data nibble 394. Data buffer 358 buffers data signals between the data pins 394 and memory chips 354, 356, 364 and 366. Similarly, the data buffer 368 connects memory chips 350, 352 attached to the front side 325 of the memory module and memory chips 360, 362 attached to the back side 335 of the memory module with a set of data pins for a back-side data nibble 396. Data buffer 368 buffers data signals between the data pins 396 and memory chips 350, 352, 360, and 362.

A data buffer 358 includes two memory chip data ports 312 and 314 and two interface data ports 316 and 318. Similarly, data buffer 368 includes two memory chip data ports 311 and 313 and two interface data ports 317 and 319. In the embodiments shown in FIG. 3 (and FIGS. 4-6), the interface data port 318 of data buffer 358 and interface data port 319 of data buffer 368 are not used and are therefore not connected to any data pins. In general, each data buffer DB has a single active interface data port. Unless otherwise stated, the interface data port of a data buffer indicated herein refers to the active interface data port.

Registering clock driver 310a generates a port selection signal that is transmitted to the data buffer row 338 on the front side via BCOM (buffer command) channel 390. Registering clock driver 310b generates another port selection signal that is transmitted to the data buffer row 348 on the back side via BCOM channel 392. The data buffers 358, 368 receive the respective port selection signals and use the respective port selection signals to select one of the memory side data ports to connect the interface side port. For example, for data buffer 358, the port selection signal can cause data buffer 358 to select one of the memory side data ports 312, 314 and connects it to the interface side port 316. Similarly, for data buffer 368, the port selection signal can cause data buffer 368 to select one of the memory side data port 311, 313 and connects it to the interface side port 317.

Memory chips 354 and 364 are connected to memory chip data port 314 of data buffer 358 via conductive traces and memory chips 356 and 366 are connected to the other memory chip data port 312 of data buffer 358 via conductive traces. The registering clock driver 310a generates chip select signals to select one of the memory chips connected to each of the memory chip data ports 312, 314 of data buffer 358 during a read/write operation. The registering clock driver 310a further generates the port selection signal for the data buffer 358 to select the memory chip data port 312, 314 to connect with the interface data port 316.

Similarly, memory chips 350 and 360 are connected to memory chip data port 313 of data buffer 368 via conductive traces and memory chips 352 and 362 are connected to memory chip data port 311 of data buffer 368 via conductive traces. The registering clock driver 310b generates chip select signals to select one of the memory chips connected to each of the memory chip data ports 311, 313 of data buffer 368 during a read/write operation. The registering clock driver 310b further generates the port selection signal for the data buffer 368 to select one of the memory chip data ports 311, 313 to connect with the interface data port 317. The interface data port 319 is not connected to any data pins.

For ease of illustration, only the trace connections for the last column of data buffers DB and memory chips MC is shown in FIG. 3. The connections along each of the remaining columns correspond to the connections shown for the last column of data buffers DB and memory chips MC.

The registering clock driver 310a selects a row of memory chips MC and connects them via row 338 of data buffers to the subset of data pins 382 attached to the front side of the memory module. The registering clock driver 310b selects another row of memory chips MC and connects them via row 348 of data buffers to the subset of data pins 384 attached to the back side of the memory module. The data available on the data pins attached to the front side and the back side together forms a word that is read from or written to the memory module.

Figure 4:
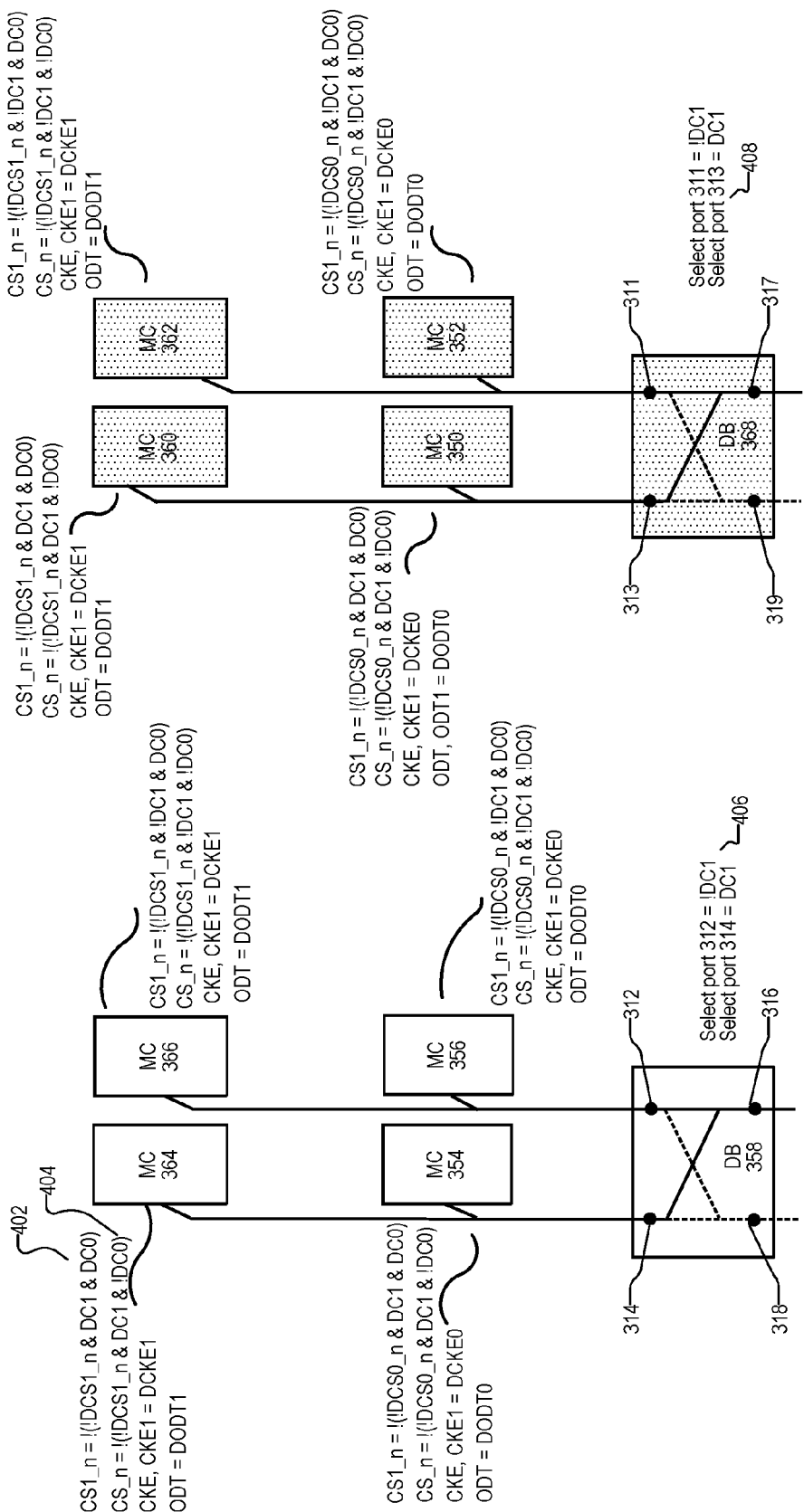
FIG. 4 illustrates the logic of the registering clock driver for generating the secondary command/address signals provided as inputs to the memory chips and port selection signals for data buffers when the memory chips are dual-die package memory chips, according to an embodiment.

FIG. 4 illustrates the logic of the registering clock driver for generating the secondary C/A signals provided as inputs to the memory chips and port selection signals for data buffers when the memory chips are dual-die package memory chips, according to an embodiment. Next to each memory chip MC is a list of secondary C/A signals provided to the memory chip MC, and also logical equations used by the registering clock drivers 310 to generate the secondary C/A signals. Some of the primary C/A signals used for generating secondary C/A signals for the memory chips MC are chip ID signals (DC1, DC0), chip select signals (DCS1_n and DCS0_n), clock enable signals (DCKE1 and DCKE0) and on-die termination signals (DODT1, and DODT0.) The secondary C/A signals provided to the memory chips are chip select signals (CS1_n and CS_n), clock enable signals (CKE and CKE1), and on-die termination signal (ODT.)

As an example, formula 402 shows that the CS1_n input signal for the memory chip 364 is determined by the registering clock driver 310a with the logical expression "!(!DCS1_n & DC1 & DC0)". Formula 404 shows that the CS_n input signal for the memory chip 364 is determined by the registering clock driver 310a with the logical expression "!(!DCS1_n & DC1 & !DC0)." Formula 406 shows that the port select signal is based on the DC1 signal input to the registering clock driver 310a.

FIG. 4 also shows how data buffer 358 includes multiplexing logic to selectively connect one of the memory chip data ports 312,314 at a time to interface data port 316. When one memory chip data port 312, 314 is connected, the other one of the memory chip data port 312, 314 is disconnected from the interface data port 316. Similarly, data buffer 368 includes multiplexing logic to selective connect one of the memory chip data ports 311, 313 at a time to interface data port 317. Each port can communicate the appropriate data signals for a data nibble.

Also, next to each memory chip MC is a list of logical equations used by the registering clock drivers 310 to generate the port selection signals. As shown, chip ID signal DC1 is used to generate the port selection signals for both data buffer 358 and data buffer 368.

Figure 5:
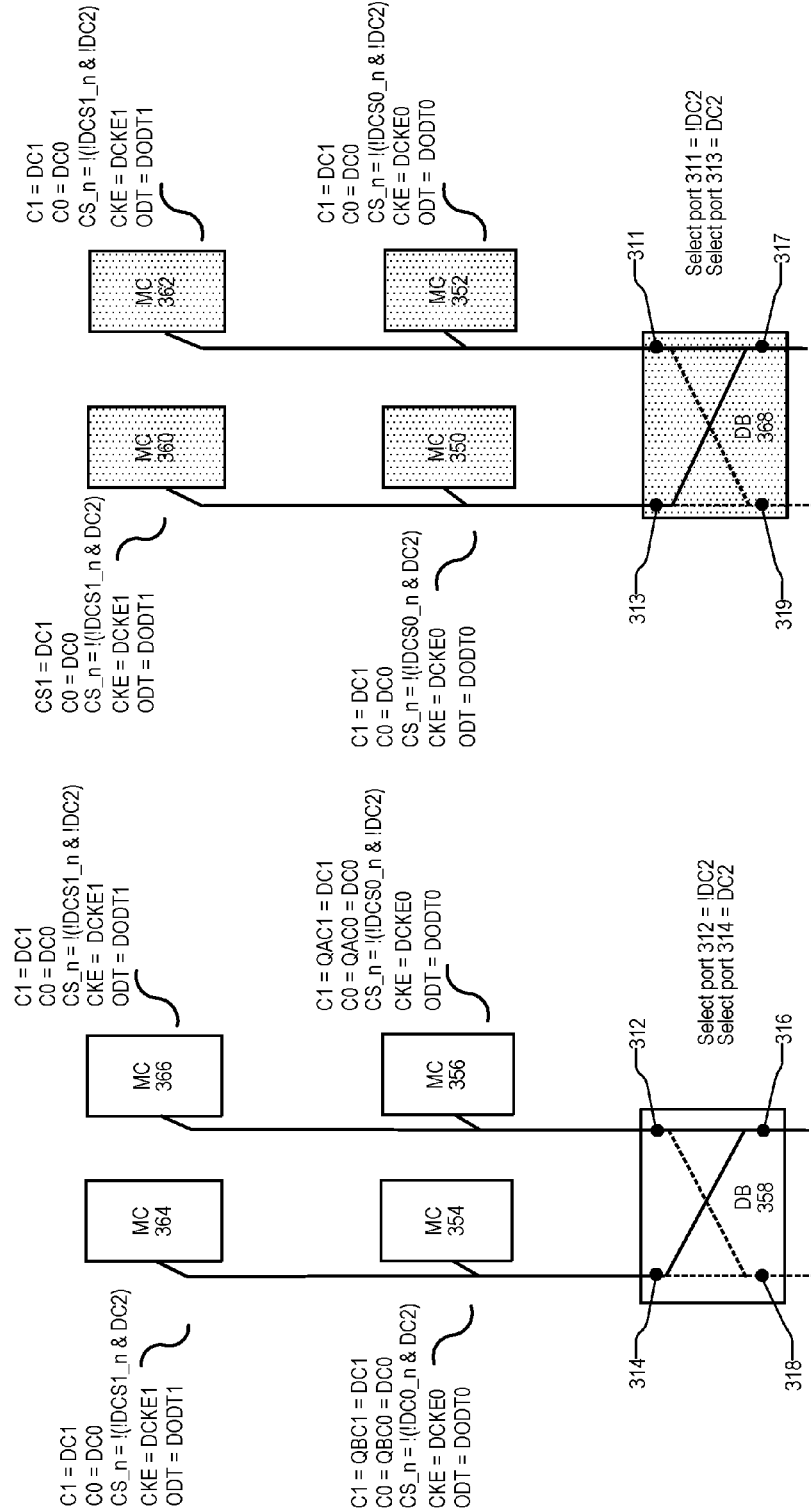
FIG. 5 illustrates the logic of the registering clock driver for generating the secondary command/address signals provided as inputs to the memory chips and port selection signals for data buffers when the memory chips are three-dimensional stacked memory chips, according to an embodiment.

FIG. 5 illustrates the logic of the registering clock driver for generating the secondary C/A signals provided as inputs to the memory chips MC and port selection signals for data buffers when the memory chips are three-dimensional stacked memory chips with four stacked die, according to an embodiment. The signal names used for inputs of the registering clock driver in FIG. 5 are as described above in connection with FIG. 4. The secondary C/A signals provided as inputs to the three-dimensional stacked memory chips include a chip select signal (CS_n), clock enable signal (CKE), on-die termination signal (ODT), and chip ID signals Cl and C0. The port select signal is based on the DC2 signal input to the registering clock drivers.

Figure 6:
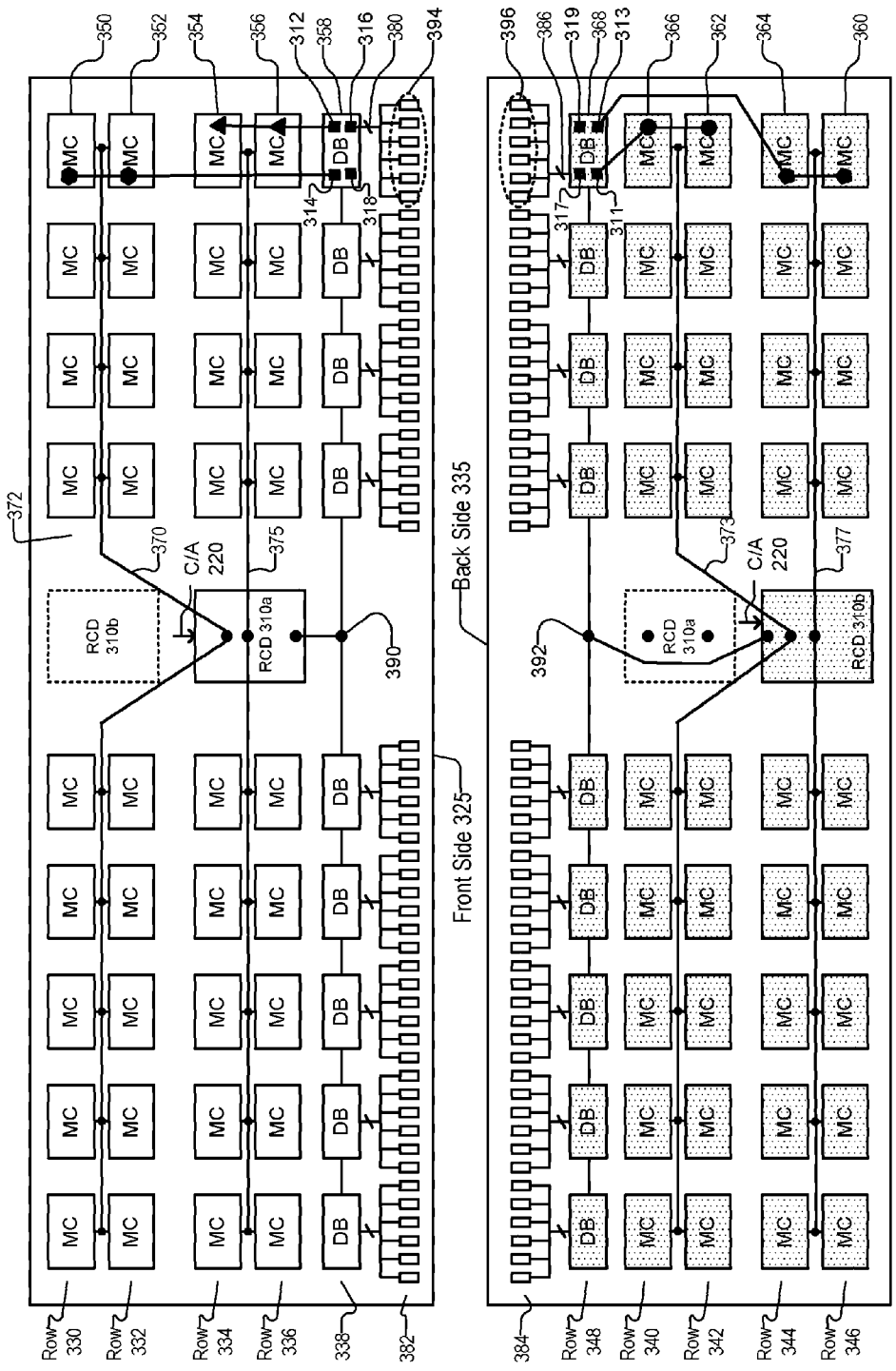
FIG. 6 illustrates a memory module with two registering clock drivers and eighteen data buffers with memory chips arranged in a side by side layout, according to an embodiment.

FIG. 6 illustrates a memory module with two registering clock drivers and eighteen data buffers arranged in a side by side layout, according to an embodiment. This memory module 140 of FIG. 6 is similar to the memory module 140 of FIG. 3, but now memory chip rows 330, 332, 334, 336 and data buffer row 338 on the front side 325 of the memory module are controlled by the registering clock driver 310a attached to the front side of the memory module. In particular, memory chip rows 330 and 332 are connected to the registering clock driver 310a by conductive traces 370 and memory chip rows 334 and 336 are connected to the registering clock driver 310a by conductive traces 375. Similarly, memory chip rows 340, 342, 344, 346 and data buffer row 348 on the back side of the memory module are connected to the registering clock driver 310b attached to the back side 335 of the memory module. In particular, memory chip rows 340 and 342 are connected to the registering clock driver 310b by conductive traces 373 and memory chip rows 344 and 346 are connected to the registering clock driver 310b by conductive traces 377.

In the side by side layout, the memory chips 350 and 352 are connected to memory chip data port 314 of the data buffer 358 and memory chips 354 and 356 are connected to the memory chip data port 312 of the data buffer 358. Similarly, the memory chips 360 and 364 are connected to memory chip data port 313 of the data buffer 368 and memory chips 362 and 366 are connected to the memory chip data port 311 of the data buffer 368.

Figure 7:
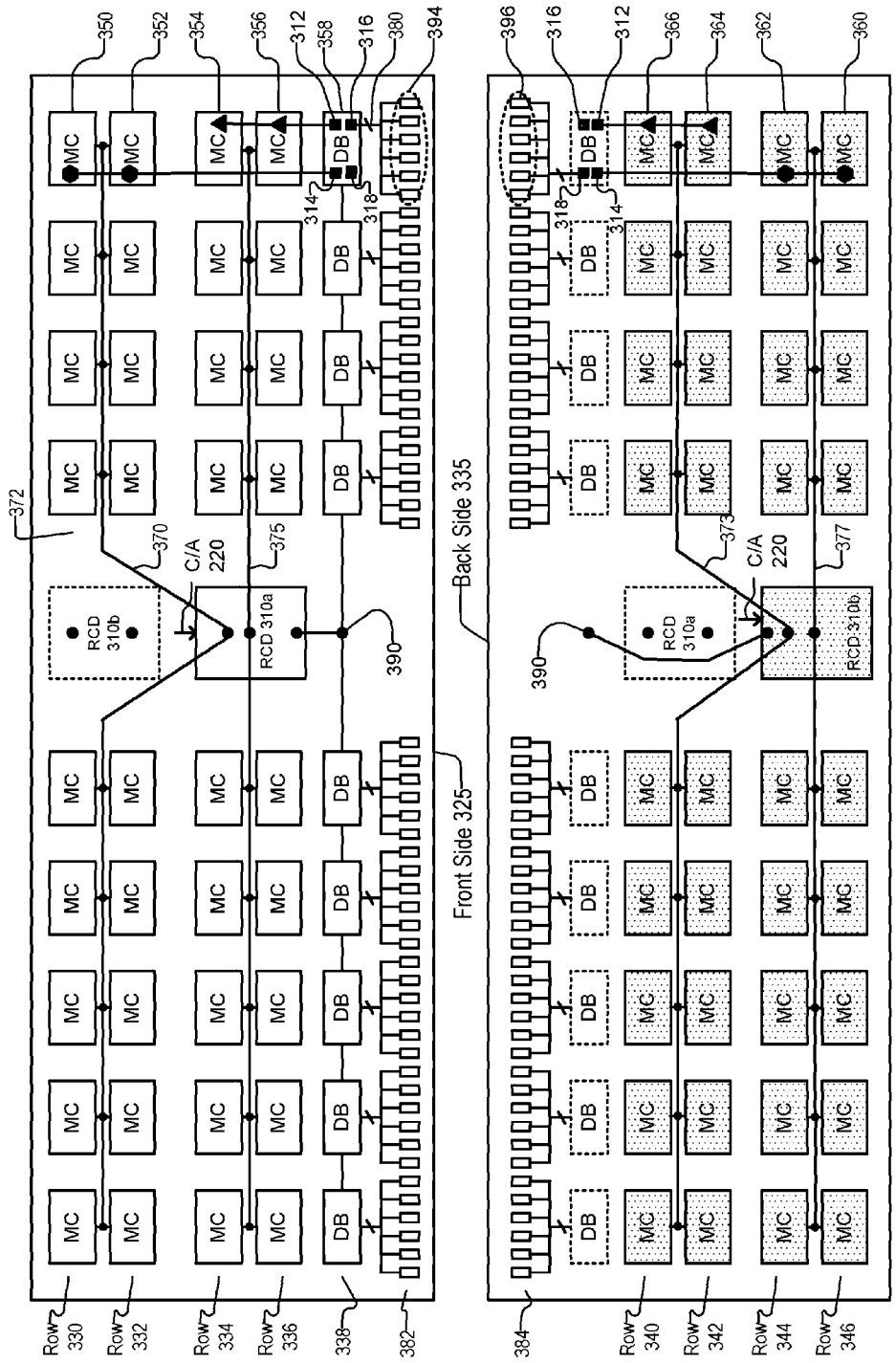
FIG. 7 illustrates a memory module with two registering clock drivers and nine data buffers with memory chips arranged in a side by side layout, according to an embodiment.

FIG. 7 illustrates a memory module with two registering clock drivers 310a, 310b and nine data buffers DB with memory chips arranged in a side by side layout, according to an embodiment. In this embodiment, the number of data buffers DB is half of the number of data buffers DB used in the memory modules shown in FIGS. 3 and 6. There are nine data buffers DB attached to the front side 325 of the memory module. The memory chips MC from the front side 325 as well as the memory chips MC from the back side 335 of the memory module are connected to the data buffers DB attached to the front side 325. In this embodiment, both interface data ports 316 and 318 of the data buffers DB are utilized and are connected to the data pins 382 and 384 of the external interface.

Four memory chips MC are connected to each memory chip data port 312, 314 of a data buffer DB. For example, as shown in FIG. 7, memory chips 354, 356, 364, and 366 are connected to memory chip data port 312 of data buffer 358. Memory chips 350, 352, 360, and 362 are connected to the memory chip data 314 port of data buffer 358. The data buffer 358 connects one memory chip data port to interface data port 316 and the other memory chip data port to the interface data port 318. As shown in FIG. 7, the interface data port 316 is connected to an even data nibble of the data channel corresponding to set 394 of the data pins and the interface data port 318 is connected to an odd nibble of the data channel corresponding to set 396 of the data pins.

Figure 8:
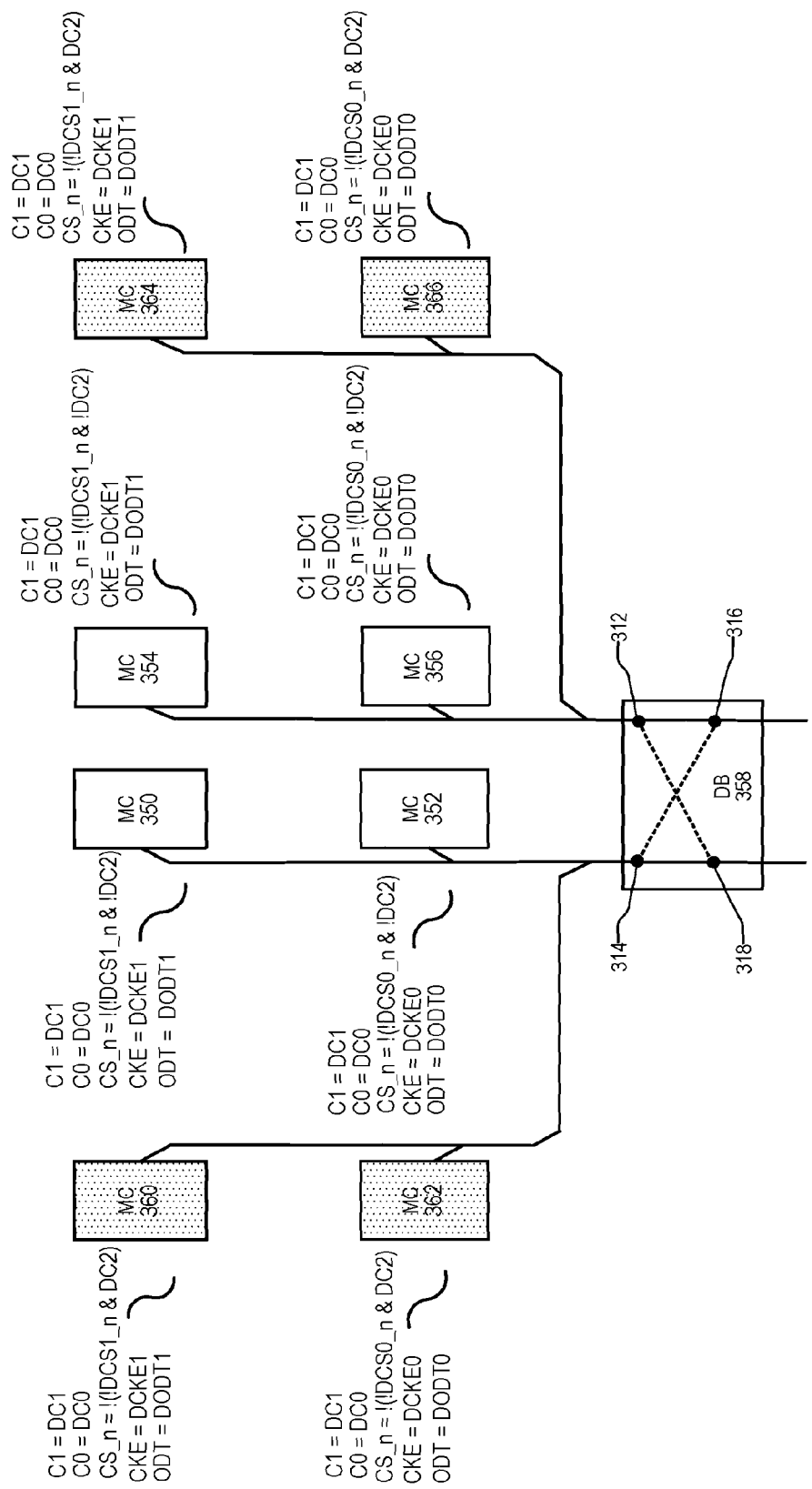
FIG. 8 illustrates the logic of the registering clock driver for generating the secondary command/address signals provided as inputs to the memory chips and port selection signals for data buffers for the memory module illustrated in FIG. 7, according to an embodiment.

FIG. 8 illustrates the logic of the registering clock driver for generating the secondary command/address signals provided as inputs to the memory chips and port selection signals for data buffers for the memory module illustrated in FIG. 7 when the memory chips are three-dimensional stacked memory chips with four stacked die, according to an embodiment. The names of the signals are as described for FIG. 5. The registering clock drivers generate secondary C/A signals to the memory chips MC that select one of the memory chips 350, 360, 352, 362 connected to the memory side data port 314 and one of the memory chips 354, 364, 356, 366 connected to the memory side data port 312. The data buffer 358 always connects memory side data ports 314 to the interface side data port 318 and memory side data port 312 to the interface side data port 316.

Figure 9:
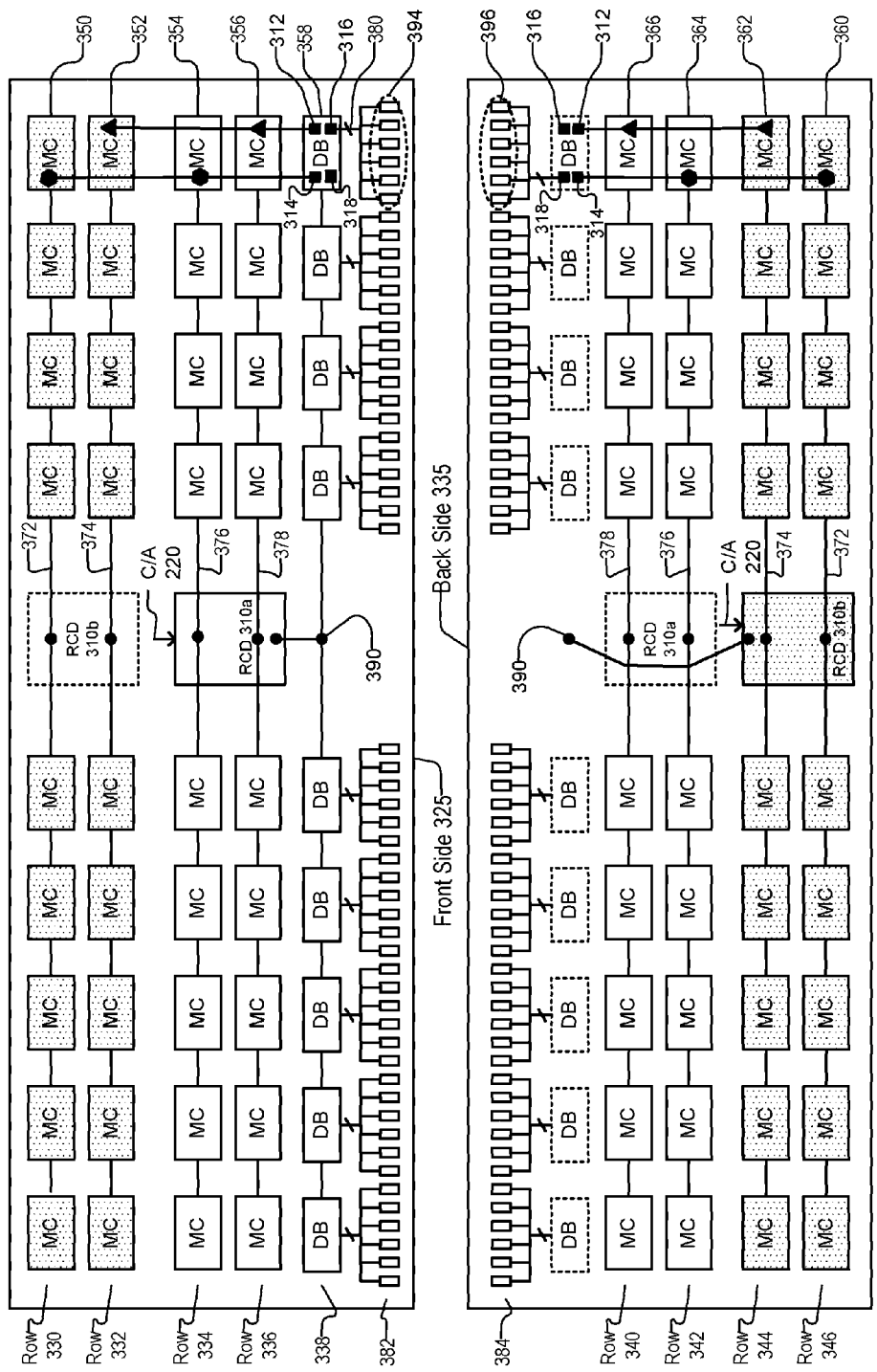
FIG. 9 illustrates a memory module with two registering clock drivers and nine data buffers with memory chips arranged in a clam shell layout, according to an embodiment.

FIG. 9 illustrates a memory module with two registering clock drivers and nine data buffers with memory chips arranged in a clam shell layout, according to an embodiment. FIG. 9 shows memory chips MC controlled by the registering clock driver 310b as shaded rectangles and memory chips MC controlled by the registering clock driver 310a as unshaded rectangles. As shown in FIG. 9, the registering clock driver 310a controls memory chips MC of rows 334 and 336 attached to the front side 325 of the memory module and rows 340 and 342 attached to the back side 335 of the memory module. Similarly, the registering clock driver 310b controls memory chips MC of rows 330 and 332 attached to the front side 325 of the memory module and rows 344 and 346 attached to the back side 335 of the memory module. Both registering clock drivers 310a and 310b generate a port selection signal that is transmitted to the data buffer row 338 on the front side via BCOM channel 390.

Upon reading this disclosure, those of skill in the art may appreciate still additional alternative designs for expanding memory capacity in a computing system. Thus, while particular embodiments and applications have been illustrated and described herein, it is to be understood that the disclosure is not limited to the precise construction and components disclosed herein. Various modifications, changes and variations which may be apparent to those skilled in the art may be made in the arrangement, operation and details of the method and apparatus disclosed herein without departing from the spirit and scope of the disclosure as defined in the appended claims.

What is claimed is:

1. A memory module comprising:
an external interface having a first set of data pins and a second set of data pins;
a first set of memory chips;
a second set of memory chips;
a first registering clock driver to control the first set of memory chips;
a second registering clock driver to control the second set of memory chips;
a first data buffer to connect the first set of memory chips to the first set of data pins; and
a second data buffer to connect the second set of memory chips to the second set of data pins.

2. The memory module of claim 1, wherein:
the first data buffer comprises a first plurality of memory chip data ports connected to the first set of memory chips and a first interface data port connected to the first set of data pins, the first data buffer selectively connecting the first interface data port to one of the first plurality of memory chip data ports; and
the second data buffer comprises a second plurality of memory chip data ports connected to the second set of memory chips and a second interface data port connected to the second set of data pins, the second data buffer selectively connecting the second interface data port to one of the second plurality of memory chip data ports.

3. The memory module of claim 2, wherein:
each memory chip data port of the first data buffer is connected to a different respective subset of the first set of memory chips; and
each memory chip data port of the second data buffer is connected to a different respective subset of the second set of memory chips.

4. The memory module of claim 3, wherein each subset of the first set of memory chips comprises a plurality of memory chips receiving different chip select signals generated by the first registering clock driver and each subset of the second set of memory chips comprises a plurality chips receiving different chip select signals generated by the second registering clock driver.

5. The memory module of claim 2, wherein:
the first registering clock driver provides a first memory chip data port select signal to the first data buffer for selecting one of the first plurality of memory chip data ports for connecting with the first interface data port; and
the second registering clock driver provides a second memory chip data port select signal to the second data buffer for selecting one of the second plurality of memory chip data ports for connecting with the second interface data port.

6. The memory module claim 1, wherein:
wherein the first set of memory chips comprises a first memory chip, a second memory chip, a third memory chip and a fourth memory chip and
wherein the first data buffer comprises a first memory chip data port connected to the first chip and the second chip, a second memory chip data port connected to the third chip and the fourth chip, and a first interface data port connected to the first set of data pins, the first data buffer selectively connecting the first interface data port to one of the first memory chip data port and the second memory chip data port,
wherein the first registering clock driver generates a first chip select signal for the first memory chip, generates a second chip select signal for the second memory chip, generates a third chip select signal for the third memory chip and generates a fourth chip select signal for the fourth memory chip,
wherein the second set of memory chips comprises a fifth memory chip, a sixth memory chip, a seventh memory chip and an eighth memory chip and
wherein the second data buffer comprises a third memory chip data port connected to the fifth chip and the sixth chip, a fourth memory chip data port connected to the seventh chip and the eighth chip, and a second interface data port connected to the second set of data pins, the second data buffer selectively connecting the second interface data port to one of the third memory chip data port and the fourth memory chip data port, and
wherein the second registering clock driver generates a fifth chip select signal for the fifth memory chip, generates a sixth chip select signal for the sixth memory chip, generates a seventh chip select signal for the seventh memory chip and generates an eighth chip select signal for the eighth memory chip.

7. The memory module of claim 1, wherein the first set of memory chips is attached to a front side of the memory module and the second set of memory chips is attached to a back side of the memory module.

8. The memory module of claim 1, wherein the first set of memory chips includes a first subset and a second subset of memory chips and the second set of memory chips includes a third subset and a fourth subset, wherein the first subset and the third subset are attached to a front side of the memory module and the second subset and the fourth subset are attached to a back side of the memory module.

9. The memory module of claim 1, wherein the first registering clock driver is attached to a front side of the memory module and the second registering clock driver is attached to a back side of the memory module.

10. The memory module of claim 1, wherein the first set of data pins corresponds to an even data nibble of the external interface and the second set of data pins corresponds to an odd data nibble of the external interface.

11. The memory module of claim 1, wherein the first data buffer is attached to a front side of the memory module and second data buffer is attached to a back side of the memory module.

12. The memory module of claim 1, wherein the first set of memory chips and the second set of memory chips are dual-die packages.

13. The memory module of claim 1, wherein the first set of memory chips and the second set of memory chips are three-dimensional stacked die packages.

14. The memory module of claim 1, wherein:
the first registering clock driver is a first integrated circuit (IC) chip, the first registering clock driver to receive primary command and address (C/A) signals and generate secondary C/A signals for the first set of memory chips from the primary C/A signals, and
the second registering clock driver is a second IC chip, the second registering clock driver to receive the primary C/A signals and generate secondary C/A signals for the second set of memory chips from the primary C/A signals.

15. The memory module of claim 14, wherein:
the first data buffer is controlled by a signal from the first registering clock driver, and
the second data buffer is controlled by a signal from the second registering clock driver.

16. A memory module comprising:
an external interface having a first set of data pins and a second set of data pins;
a first set of memory chips;
a second set of memory chips;
a first registering clock driver to control the first set of memory chips;
a second registering clock driver to control the second set of memory chips; and
a data buffer to connect the first set of memory chips to the first set of data pins and the second set of memory chips to the second set of data pins.

17. The memory module of claim 16, wherein the data buffer comprises
a first memory chip data port connected to the first set of memory chips;
a second memory chip data port connected to the second set of memory chips;
a first interface data port connected to the first set of data pins;
a second interface data port connected to the second set of data pins;
wherein the data buffer connects the first interface data port to the first memory chip data port and the second interface data port to the second memory chip data port.

18. The memory module of claim 16, wherein the first set of memory chips includes a first subset and a second subset of memory chips and the second set of memory chips includes a third subset and a fourth subset, wherein the first subset and the third subset are attached to a front side of the memory module and the second subset and the fourth subset are attached to a back side of the memory module.

19. The memory module of claim 16, wherein the data buffer has a first interface data port and a second interface data port, wherein the first interface data port corresponds to an even data nibble and the second interface data port corresponds to an odd data nibble.

\* \* \* \* \*